US 12,166,334 B2

(12) United States Patent
Brower et al.

(10) Patent No.: US 12,166,334 B2
(45) Date of Patent: Dec. 10, 2024

(54) POWER ASSEMBLY

(71) Applicant: Hubbell Incorporated, Shelton, CT (US)

(72) Inventors: John Brower, Fairfield, CT (US); Matthew Samojeden, Rye, NY (US)

(73) Assignee: Hubbell Incorporated, Shelton, CT (US)

( * ) Notice: Subject to any disclaimer, the term of this patent is extended or adjusted under 35 U.S.C. 154(b) by 190 days.

(21) Appl. No.: 17/790,372

(22) PCT Filed: Dec. 30, 2020

(86) PCT No.: PCT/US2020/067509
§ 371 (c)(1),
(2) Date: Jun. 30, 2022

(87) PCT Pub. No.: WO2021/138449
PCT Pub. Date: Jul. 8, 2021

(65) Prior Publication Data
US 2023/0056858 A1    Feb. 23, 2023

Related U.S. Application Data

(60) Provisional application No. 62/955,579, filed on Dec. 31, 2019.

(51) Int. Cl.
*H02B 1/30* (2006.01)
*H05K 5/02* (2006.01)

(52) U.S. Cl.
CPC .............. *H02B 1/30* (2013.01); *H05K 5/0234* (2013.01)

(58) Field of Classification Search
CPC ...... H02B 1/30; H05K 5/0234; H05K 5/0217; B60L 53/20; B60L 53/30; B60L 2200/32;
(Continued)

(56) References Cited

U.S. PATENT DOCUMENTS 3,895,179 A * 7/1975 Wyatt ............... H02B 1/50
220/3.94
4,307,436 A * 12/1981 Eckart ............... H02B 1/50
361/823
(Continued)

FOREIGN PATENT DOCUMENTS

CN    101568277 A    10/2009
CN    208198131 U    12/2018
(Continued)

OTHER PUBLICATIONS

International Search Report and Written Opinion mailed in Application No. PCT/US2020/067509, dated Mar. 31, 2021.
(Continued)

Primary Examiner — Adam B Dravininkas
(74) Attorney, Agent, or Firm — Michael Best & Friedrich LLP

(57) ABSTRACT

A power assembly a base assembly including a power source and a pedestal assembly. The pedestal assembly includes a head that is removably coupleable to the base assembly, a controller positioned within the head and configured to be in electrical communication with the power source when the head is coupled to the base assembly, and a receptacle assembly removably coupleable to the head and configured to be in electrical communication with the controller when the receptacle assembly is coupled to the head for supplying power to a vessel or vehicle.

16 Claims, 11 Drawing Sheets

(58) Field of Classification Search
CPC ...... B60L 2250/16; B60L 53/16; B60L 53/31; B60L 53/305; B60L 53/126; B60L 53/124; B60L 53/665; B60L 53/63; B60L 53/64; B60L 53/18; Y02T 10/70; Y02T 90/12; Y02T 90/14; Y02T 10/7072; Y02T 10/92; Y02T 90/16; H02J 7/0042; H02J 7/00047; H02J 7/0013; H02J 7/00

See application file for complete search history.

(56) References Cited

U.S. PATENT DOCUMENTS

| | | | |
|---|---|---|---|
| 4,873,600 A | 10/1989 | Vogele | |
| 5,741,149 A * | 4/1998 | Anthony | H01R 13/707 439/314 |
| 10,483,726 B1 * | 11/2019 | Seff | H02B 1/26 |
| 2008/0253062 A1 * | 10/2008 | Seff | H02B 1/50 361/622 |
| 2008/0304212 A1 | 12/2008 | Seff et al. | |
| 2010/0013434 A1 | 1/2010 | Taylor-Haw et al. | |
| 2010/0296230 A1 * | 11/2010 | Storck | B60L 53/16 320/109 |
| 2011/0169447 A1 * | 7/2011 | Brown | B60L 53/68 320/109 |
| 2012/0309455 A1 * | 12/2012 | Klose | B60L 53/68 455/557 |
| 2013/0320921 A1 | 12/2013 | Muller et al. | |
| 2014/0015487 A1 | 1/2014 | Brown et al. | |
| 2017/0062993 A1 * | 3/2017 | Sumner | H01R 13/703 |
| 2018/0375313 A1 | 12/2018 | Misener et al. | |
| 2021/0091515 A1 * | 3/2021 | Weeks | H01R 13/713 |

FOREIGN PATENT DOCUMENTS

| | | |
|---|---|---|
| DE | 102017118330 A1 | 2/2019 |
| KR | 10-1379821 | 4/2014 |

OTHER PUBLICATIONS

Extended European Search Report dated Jan. 3, 2024 for corresponding European Application No. 20910399.3 (21 pages).

Chinese Patent Application No. 202080097773.X First Office Action Issued by the China National Intellectual Property Administration dated Aug. 30, 2024, and translation.

* cited by examiner

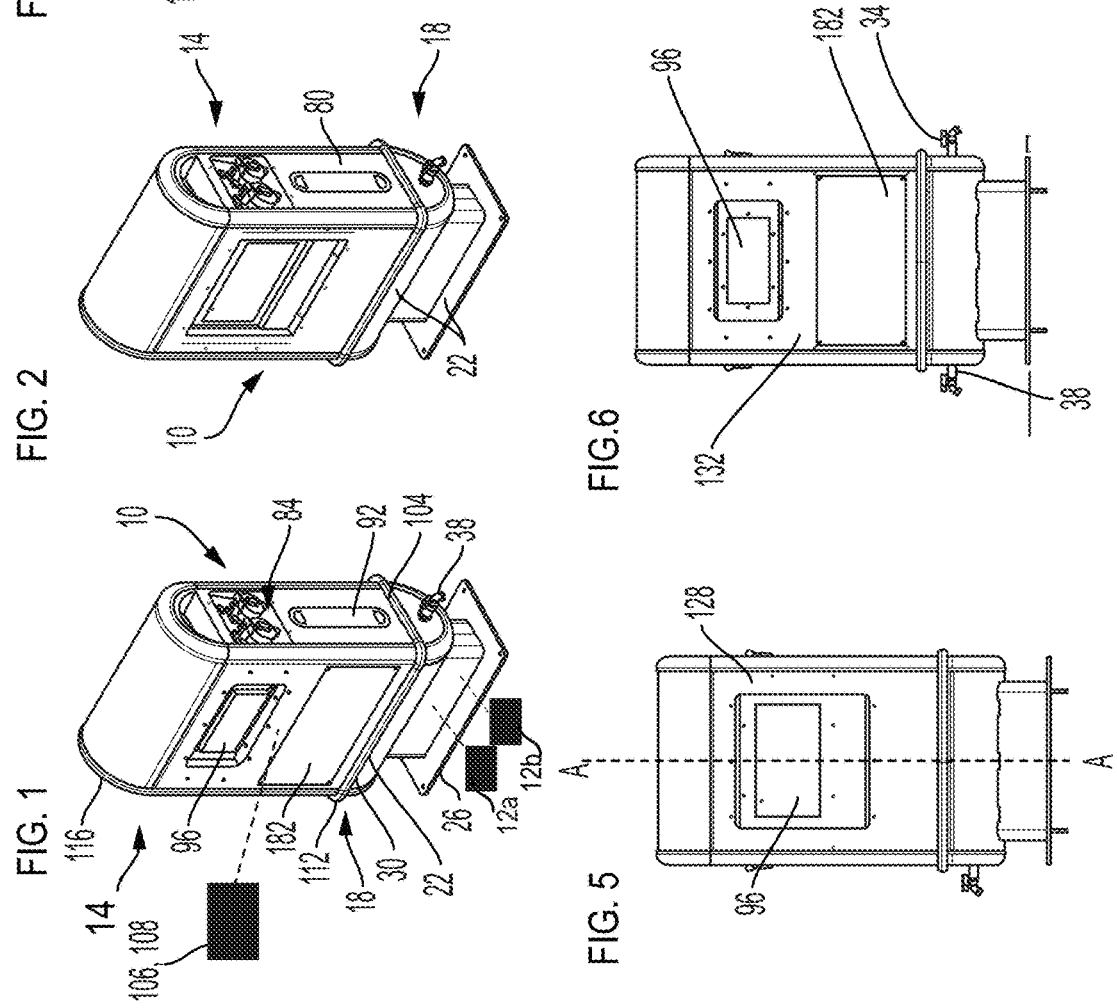

SHOWN WITH BODY REMOVED AND COVER INSTALLED

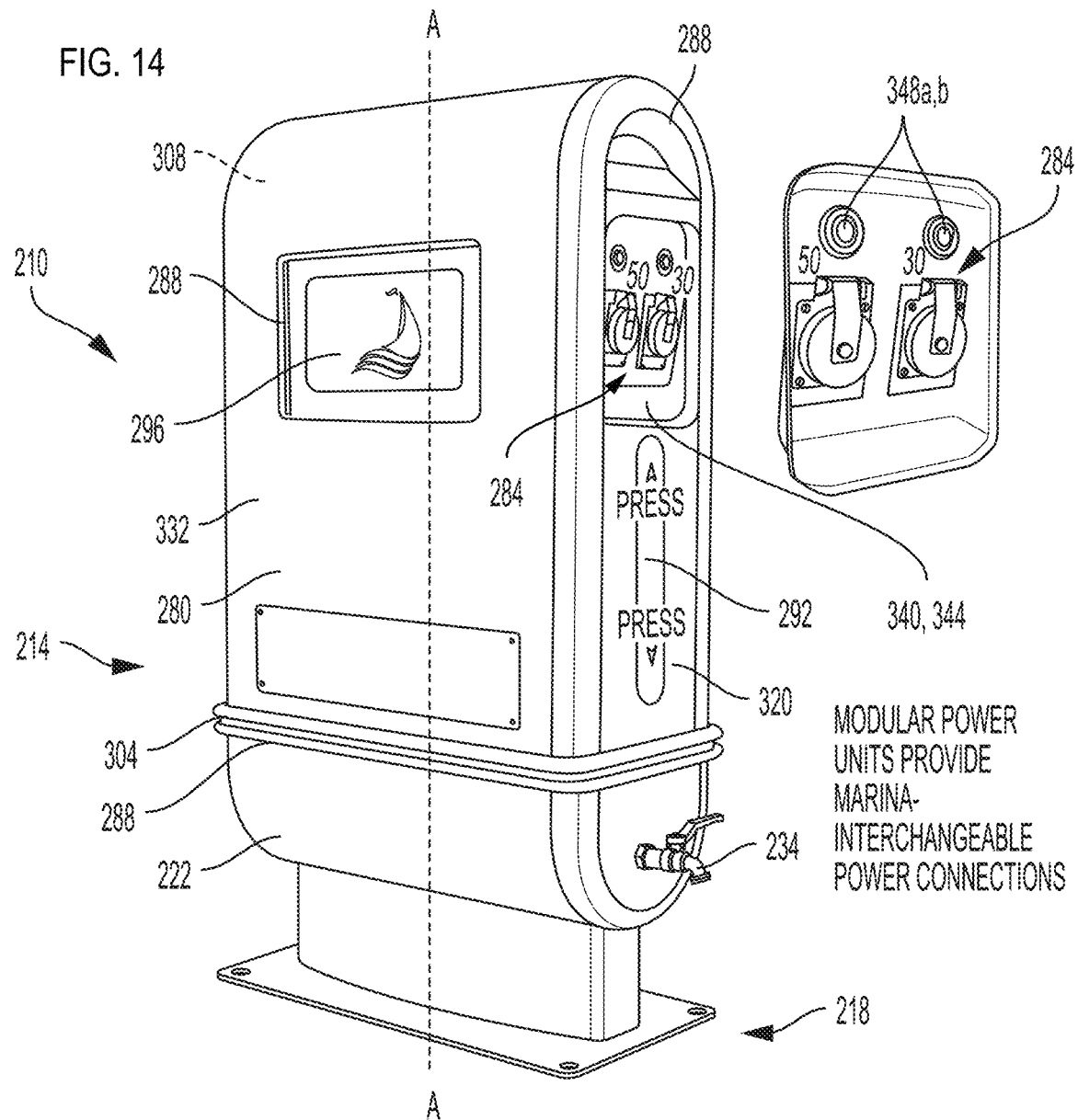

POWER ASSEMBLY

CROSS-REFERENCE TO RELATED APPLICATIONS

This application claims the benefit of prior-filed U.S. Provisional Patent Application No. 62/955,579, filed Dec. 31, 2019, the entire contents of each are incorporated by reference.

FIELD

Embodiments relate to a power assembly configured to provide power from a power source to a vessel or a vehicle (i.e., boat or electric vehicle).

SUMMARY

In one embodiment, a power assembly a base assembly includes a power source and a pedestal assembly. The pedestal assembly includes a head that is removably coupleable to the base assembly, a controller positioned within the head and configured to be in electrical communication with the power source when the head is coupled to the base assembly, and a receptacle assembly removably coupleable to the head and configured to be in electrical communication with the controller when the receptacle assembly is coupled to the head for supplying power to a vessel or vehicle.

In another embodiment, a power assembly a base assembly includes a power source and a pedestal assembly. The pedestal assembly includes a head that is removably coupleable to the base assembly, a controller positioned within the head and configured to be in electrical communication with the power source when the head is coupled to the base assembly, and a first receptacle assembly removably coupleable to the head and configured to be in electrical communication with the controller when the first receptacle assembly is coupled to the head for supplying power to a first device. The first receptacle assembly is replaceable with a second receptacle assembly. The second receptacle assembly is removably coupleable to the head and configured to be in electrical communication with the controller when the second receptacle assembly is coupled to the head for supplying power to a second device.

In another embodiment, a method for assembling a power assembly includes electrically and physically coupling a head of a pedestal assembly to a base assembly that accommodates a power source, and electrically and physically coupling a receptacle assembly to the head of the pedestal assembly, the receptacle assembly configured to provide power from the power source to a device.

Other aspects will become apparent by consideration of the detailed description and accompanying drawings.

BRIEF DESCRIPTION OF THE DRAWINGS

FIG. 1 is a first perspective view of a power assembly according to one embodiment, the power assembly including a body assembly and a pedestal assembly.

FIG. 2 is a second perspective view of the power assembly of FIG. 1.

FIG. 3 is a first side view of the power assembly of FIG. 1.

FIG. 4 is a second side view of the power assembly of FIG. 1.

FIG. 5 is a third side view of the power assembly of FIG. 1.

FIG. 6 is a fourth side view of the power assembly of FIG. 1.

FIG. 7 is a bottom view of the power assembly of FIG. 1.

FIG. 8 is a top side view of the power assembly of FIG. 1.

FIG. 14 is a perspective view of a power assembly according to another embodiment.

DETAILED DESCRIPTION

Figure 9:
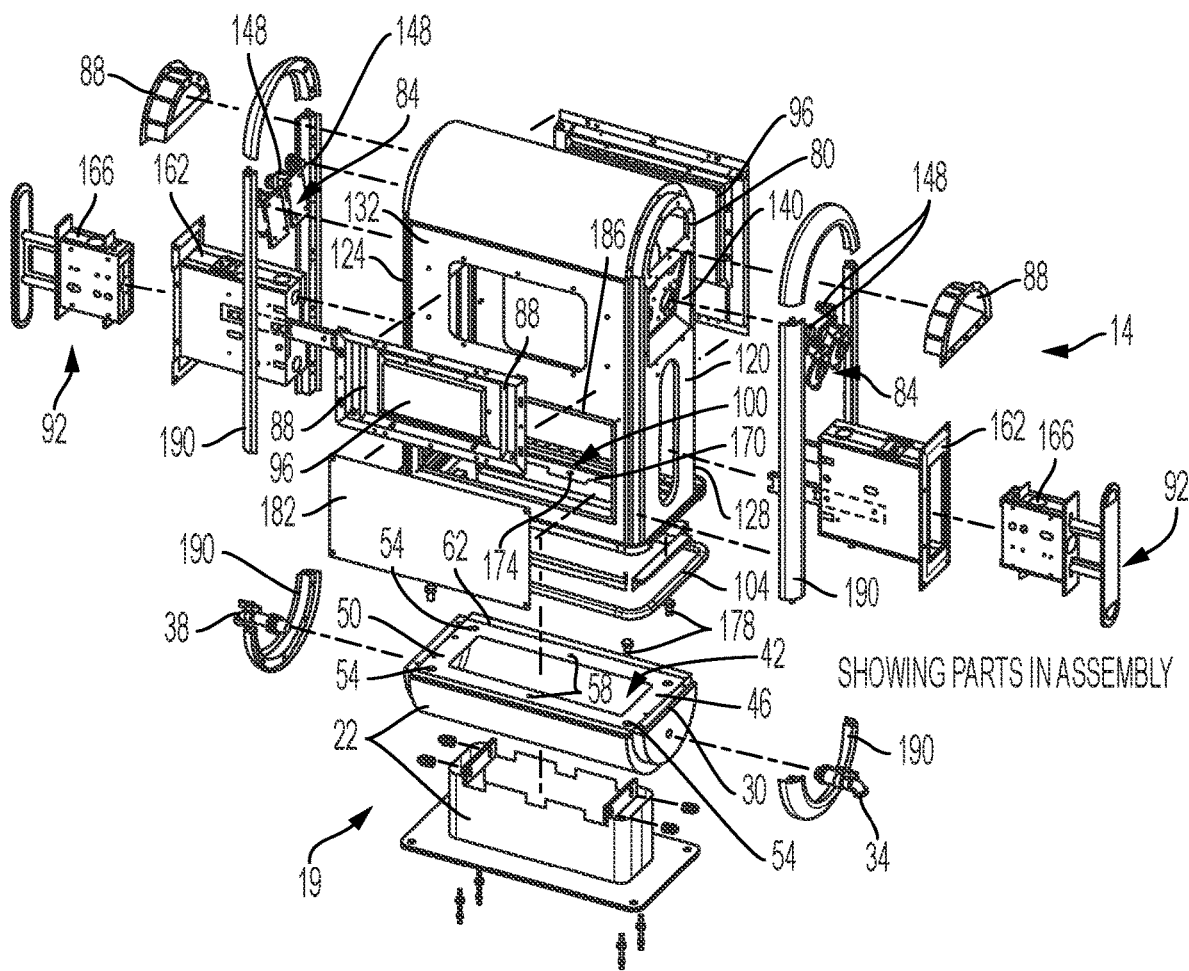
FIG. 9 is an exploded view of the power assembly of FIG. 1.

Before any embodiments are explained in detail, it is to be understood that the application is not limited in its application to the details of construction and the arrangement of components set forth in the following description or illustrated in the following drawings. Other embodiments, than those described below, are capable of being practiced or of being carried out in various ways.

FIGS. 1-9 illustrate a power assembly 10 according to one embodiment. The power assembly 10 is configured to communicate (e.g., provide power and/or water) from a power source 12a and/or water source 12b (e.g., a dock or the ground) to a device (e.g., a vessel or vehicle)s positioned adjacent the power assembly 10. For example, the power assembly 10 may be a marine power assembly 10 that is configured to communicate (e.g., provide power and/or water) from the shore (e.g., a dock or the ground) to a vessel positioned adjacent the shore. In another example, the power assembly 10 may be an electric vehicle power assembly 10 that is configured to communicate (e.g., provide power) to an electric vehicle positioned adjacent the shore. The power assembly 10 defines a longitudinal axis A (FIGS. 3, 5) and includes a body or pedestal assembly 14 that is removably coupleable to a base assembly 18 along the longitudinal axis A.

Figure 13:
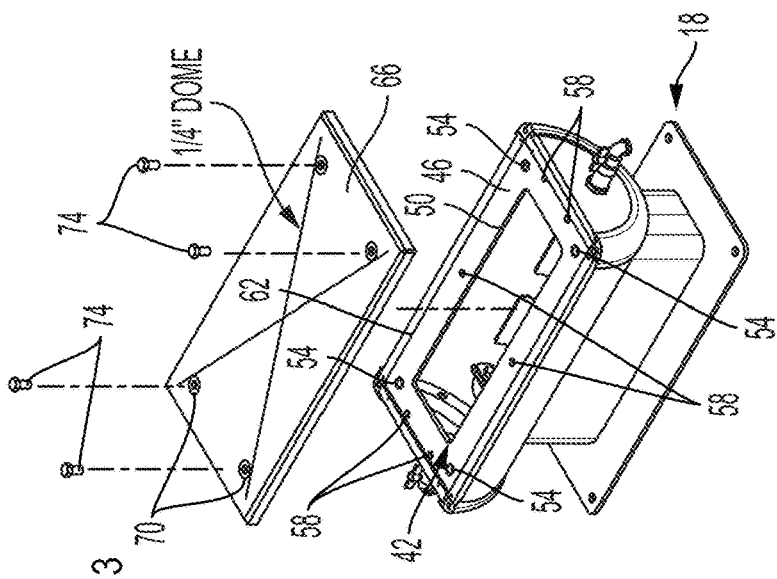
FIG. 13 is an exploded view of the pedestal assembly of FIG. 1.
Figure 11:
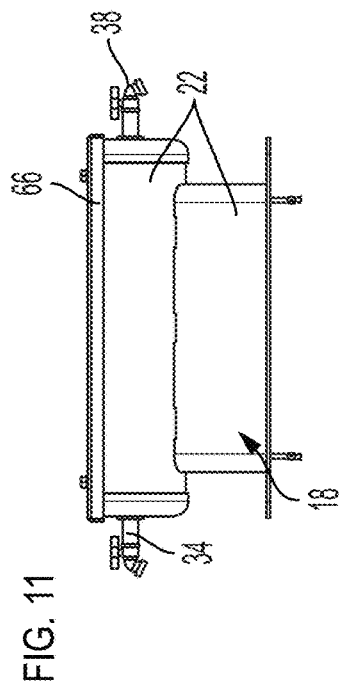
FIG. 11 is a third or fourth side view of the pedestal assembly of FIG. 1.
Figure 10:
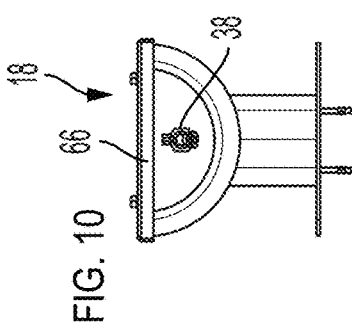
FIG. 10 is a first or second side view of the pedestal assembly of FIG. 1.
Figure 12:
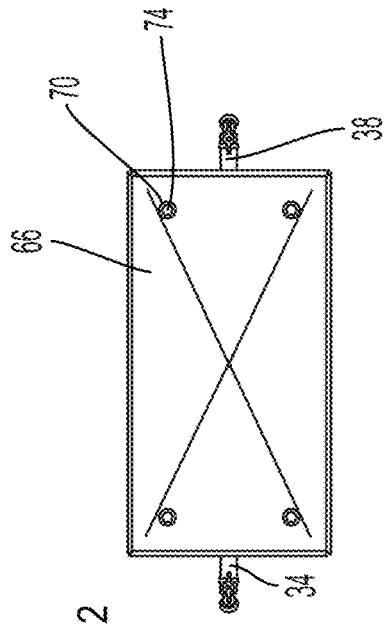
FIG. 12 is a top view of the pedestal assembly of FIG. 1.

As shown in FIGS. 1-13, and particularly with respect to FIGS. 9-13, the base assembly 18 accommodates the power source 12a and the water source 12b and includes a support member 22 with a first end 26 that is coupleable (e.g., by fasteners or the like) to a support surface (e.g., the ground or a dock) and a second end 30 that is positioned opposite the first end 26. In the illustrated embodiment, the support member 22 includes a first portion and a second portion that are coupled together, but in other or additional embodiments, the support member 22 may be one unitary (e.g., integrally-formed) piece. The support member 22 includes a first valve 34 and a second valve 38, each of which can be used to provide water from water source 12b to the shore to the vessel. A coupling mechanism 42 is positioned within the support member 22. As shown in FIGS. 9 and 13, the coupling mechanism 42 includes a body 46 that has a central aperture 50 extending therethrough parallel to the longitudinal axis A, a first plurality of apertures 54 extending therethrough parallel to the longitudinal axis A, and a second plurality of apertures 58 extending therethrough parallel to the longitudinal axis A. In the illustrated embodiment, the first plurality of apertures 54 includes four circular, threaded apertures that are positioned adjacent corners of the body 46, but in other or additional embodiments, the apertures may have any suitable number, shape, or orientation relative to the body. In the illustrated embodiment, the second plurality of apertures 58 includes six circular, threaded apertures that are positioned at other locations in the body. The second end 30 extends beyond the coupling mechanism 42 to create a lip 62. The support member 22 is hard wired to provide power to the base assembly 18. The base assembly 18 may be formed from steel (e.g., stainless steel), aluminum, a combination of steel and aluminum or any other suitable material.

With respect to FIGS. 10-13, the base assembly 18 further includes a cover 66 that is removably coupleable to the support member 22. The cover 66 includes a plurality of circular through-holes 70. Each of the through-holes 70 corresponds to one of the first plurality of apertures 54 in the coupling mechanism. Fasteners 74 (e.g., screws or the like) are received by the through-holes 70 and apertures 54 to couple the cover 66 to the support member 22 when the pedestal assembly 14 is not in use. Accordingly, the cover 66 seals the base assembly 18. The cover 66 may be formed from steel (e.g., stainless steel) or any other suitable material.

With renewed respect to FIGS. 1-9, the pedestal assembly 14 includes a head or frame 80, a plurality of power units 84, a plurality of illumination devices 88, one or more cord management devices 92, one or more display screens or indicators 96, a coupling mechanism 100, and a sealing mechanism 104. The pedestal assembly 14 is configured to physically and electrically communicate with the base assembly 18. Accordingly, positioned within the head 80 are one or more wires (not shown) that are selectively coupled to wires (not shown) in the base assembly 18, which are in communication with the power source 12a. An electronics control module 106 is positioned within the head 80, as well, and includes a controller 108 that is configured to communicate with the power source 12a and the water source 12b when the head pedestal assembly 14 and base assembly 18 are coupled to one another. The controller 108 is also configured to communicate with the power units 84, the illumination devices 88, and the display screens 96. The head 80 is WiFi enabled, for example, with a mesh WiFi capability. The pedestal assembly 14 may be formed from aluminum or any suitable material. Also, like the base assembly 18, the pedestal assembly 14 may include a gloss or color that is capable of withstanding the elements. That is, the pedestal assembly can withstand at least 2000 hours without a change in color or gloss that is typical as a result of salt and ultraviolet light.

In the embodiment of FIGS. 1-13, the head 80 includes a first end 112, a second end 116 opposite the first end 112, a first side 120, a second side 124 opposite the first side 120, a third side 128, and a fourth side 132 opposite the third side 128. The sides 120, 124, 128, 132 extend between the first and the second ends 112, 116. The first end 112 is configured to be coupled to the second end 30 of the base assembly 18, which will be discussed in greater detail below. The second end 116 is closed.

As shown in FIGS. 3, 4, and 9, two power units 84 are positioned on each of the first and the second sides 120, 124. As shown, the power units 84 are positioned within recesses 140, 144 in each of the first and second sides 120, 124. The power units 84 are modular (e.g., interchangeable or customizable) and may include any suitable interface (e.g., terminal configuration) and power rating (e.g., current, voltages, and/or wattages). For example, the plurality of modular power units 84 may have connectors that accommodate 30 A and 125V connectors, 50 A and 125V/250V connector, or have any suitable power rating. Also, one or more of the power units 84 may be suitable for an electric vehicle charger. Moreover, one or more of the power units 84 may include in inductive charger. The power units 84 may be include the same type of power unit or different types of power units. Moreover, one or more of the power units 84 may include a ground-fault circuit interrupter (GFCI, not shown in FIGS. 1-9) as well. An exemplary configuration for the power unit 284 is discussed in greater detail below relative to the embodiments of FIGS. 14-21. The power units 84 of FIGS. 1-9 may be configured in the same or similar way as the power units 284 of FIGS. 14-21.

Additionally, an actuator or button 148 is positioned adjacent each of the power units 84 to actuate the respective power unit 84 once a mating interface of a plug of the vessel is physically and electrically coupled to the respective power unit. Additionally, one cord and hose management mechanism 92 is positioned on each of the first sides and the second sides 120, 124. In the illustrated embodiment, each of the cord and hose management mechanisms 92 includes a housing 162 positioned within the head 80 and a holder 166 selectively positioned within a housing 162. The holder 166 may be biased (e.g., by a spring), telescopically, or otherwise translatably or slideably coupled within the housing 166. Accordingly, the cord and hose management mechanism 92 can have a first position in which the holder 162 is positioned within the housing 166 (and therefore the head 80) and a second position in which the holder 162 is positioned outside of and spaced apart from the housing 162 (and therefore the head 80). In the second position, the holder 162 can accommodate a cord, a rope, or a hose (not shown).

As shown in FIG. 5, one display screen 96 is positioned on each of the third and fourth sides 128, 132. Both display screens 96 are configured to be in communication with the controller 108. One display screen 96 is configured to display information to the user. In the illustrated embodiment, the display screen 96 is configured to display the location or name of the marina, the status of plurality of modular power units, the time, and the temperature. One display screen 96 can include ownership or other indicia. In other or alternative embodiments, either of the display screens 96 may display other or additional information than shown and described herein.

As shown in FIGS. 1-9, the head 80 includes illumination devices 88 on each of the sides 120, 124, 128, 132 as well as an illumination device 88 adjacent the first end 112. In the illustrated embodiments, the illumination devices 88 are light-emitting diodes (LEDs), but in other or additional embodiments, other suitable illumination devices may be used. The illumination devices 88 serve to illuminate the power assembly 10, the features of the power assembly (e.g., the power units), and for emergency lighting.

As shown in FIG. 9, the coupling mechanism 100 is a lip or flange 170 that has a plurality of through holes 174 (only one of which is shown). Each of the through-holes 174 correspond to an aperture 54, 58 in the coupling mechanism 42 of the base assembly. Fasteners 178 (e.g., screws or the like) are received by the through-holes 174 and apertures 54, 58 to couple the head 80 to the support member 22 of the base assembly 18 when the pedestal assembly 14 is in use. Fasteners 178 may couple the apertures 54 to a corresponding aperture 178 in the flange 170, the apertures 58 to a corresponding aperture 178 in the flange 170 or both apertures 54, 58. The through-holes 178 in the head 80 are accessible through a removable panel 182 secured (e.g., by fasteners or the like) over an aperture 186 in the head 80.

Moreover, the sealing device 104 (e.g., a gasket) seals the interface of the pedestal assembly 14 and base assembly 18 to prevent moisture and debris from entering the interior of the power assembly. Also, bumpers 190 (FIG. 9) formed from rubber or other suitable flexible material are coupled to the power assembly 10.

In operation, the power assembly 10 can provide power via the plurality of power units 84 from the shore to a vessel and provide water via the first and second valves 34, 38 to a vessel. Users can derive information from the power assembly 10 through the WiFi network an app on a mobile device (not shown). For example, the vessel owners can obtain customized content including but not limited to power status of the vessel and other alerts, while marina owners can receive customized content including but not limited to water reporting, electric reporting, emergency alerts and reporting, power status and alerts. During the winter months or inclement weather (e.g., a hurricane or tropical storm), the pedestal assembly 14 can be removed from the base assembly 18. In particular, the head 80 is disconnected from the support member 22 (e.g., the fasteners are unfastened and removed), the wires (not shown) are decoupled, and the head 80 is lifted off of the support member 22. When the pedestal assembly 14 is removed from the base assembly 18, the cover 66 is coupled to the support member 22 and seals the base assembly 18.

Figure 15:
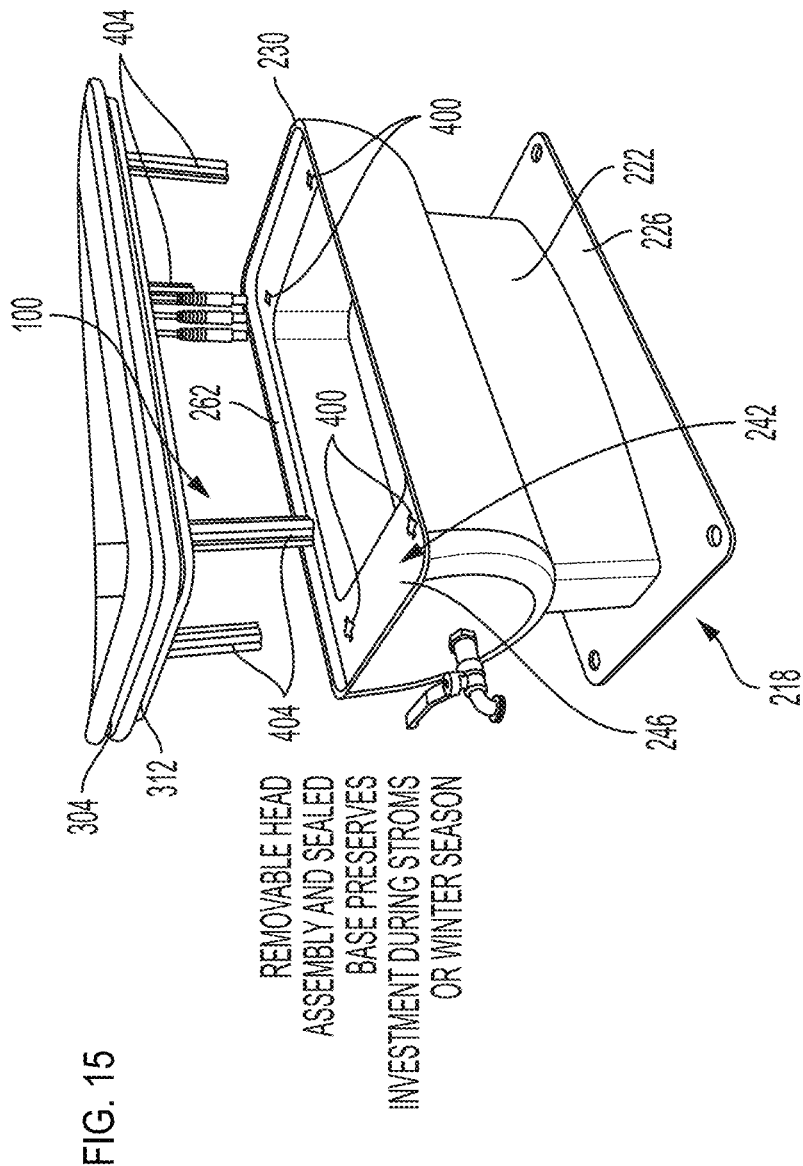
FIG. 15 is a detailed view of apportion of the power assembly of FIG. 14.
Figure 16:
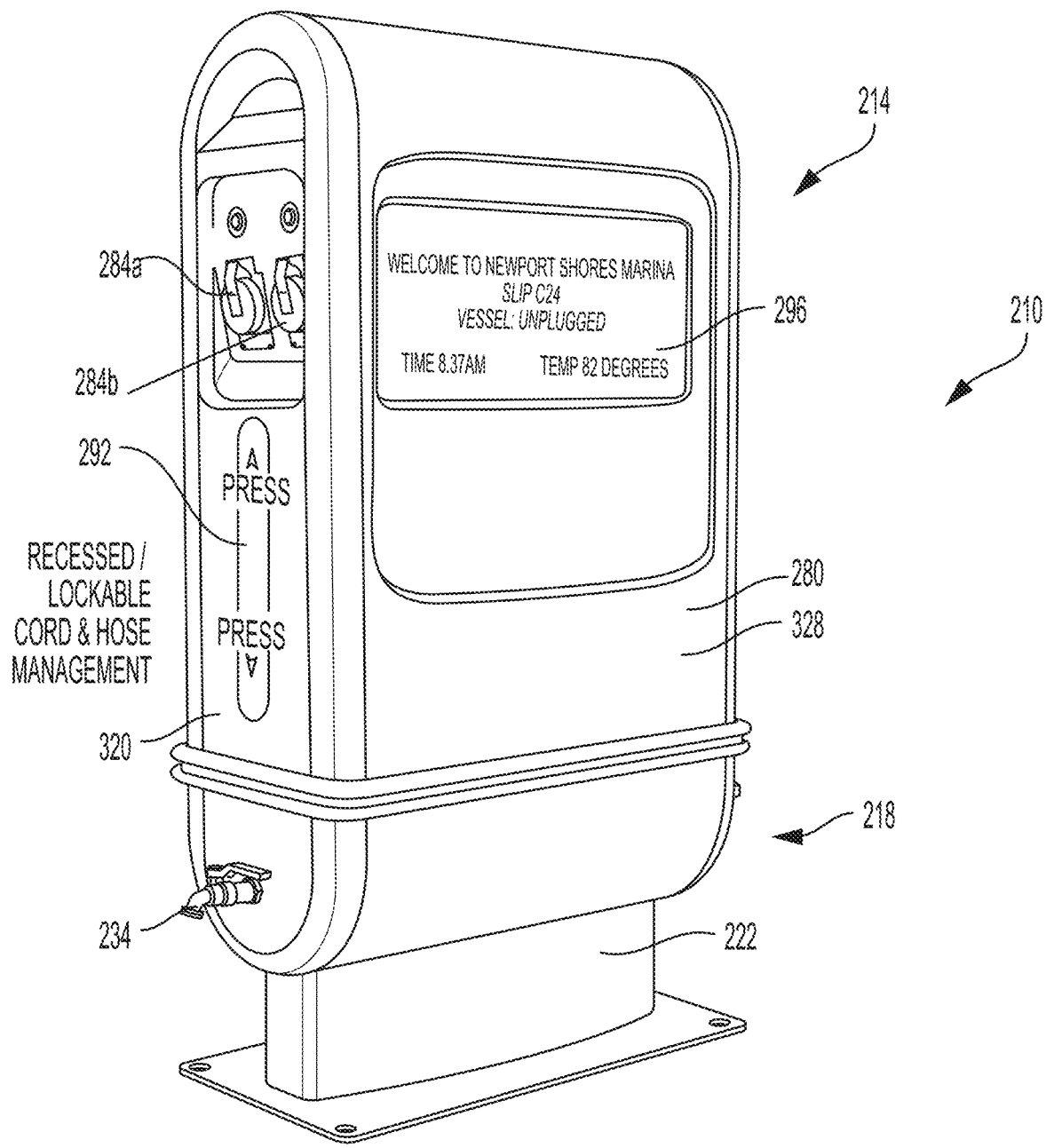
FIG. 16 is another perspective view of the power assembly FIG. 14.
Figure 17:
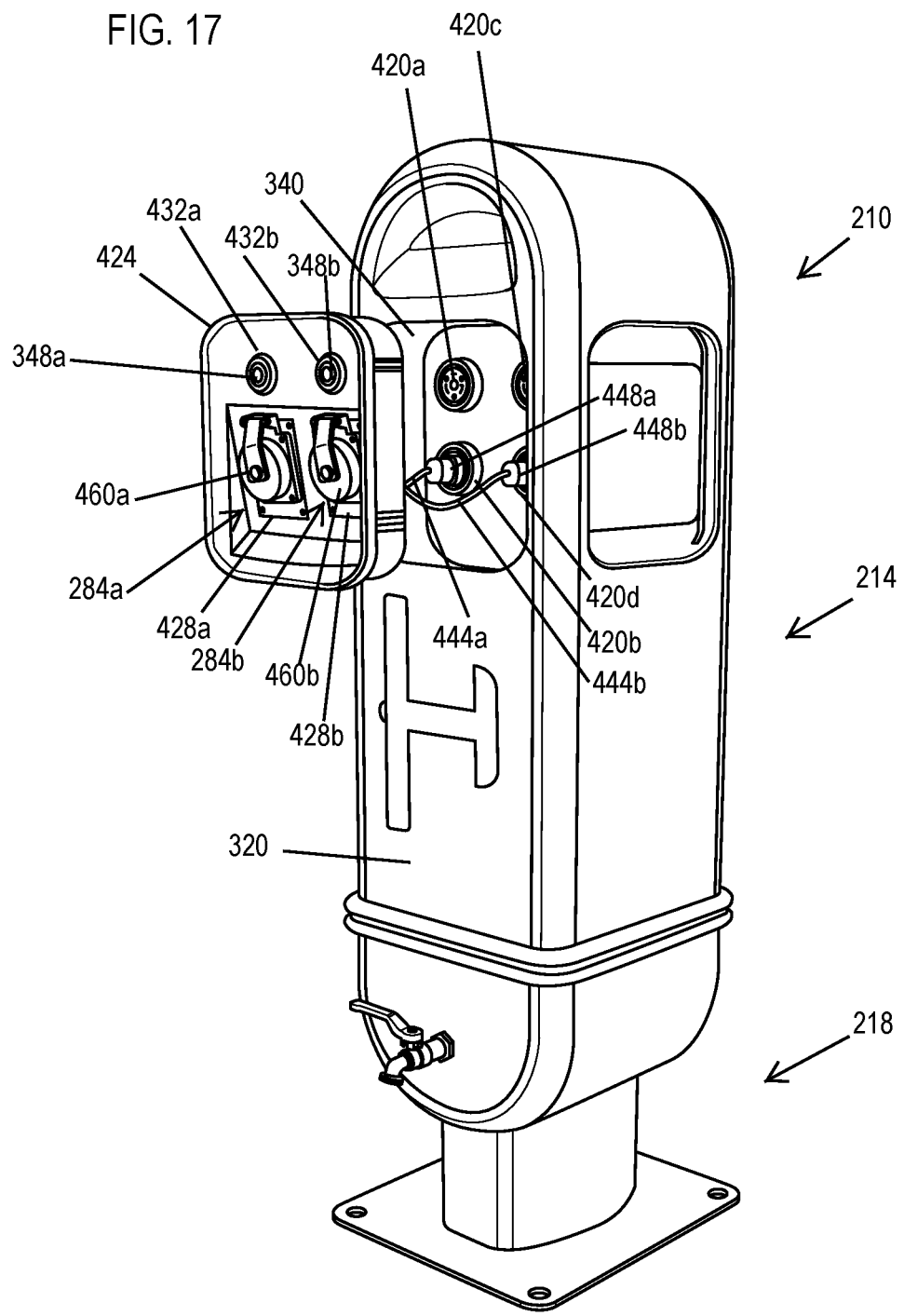
FIG. 17 is a partially exploded perspective view of the power assembly of FIG. 14.
Figure 18:
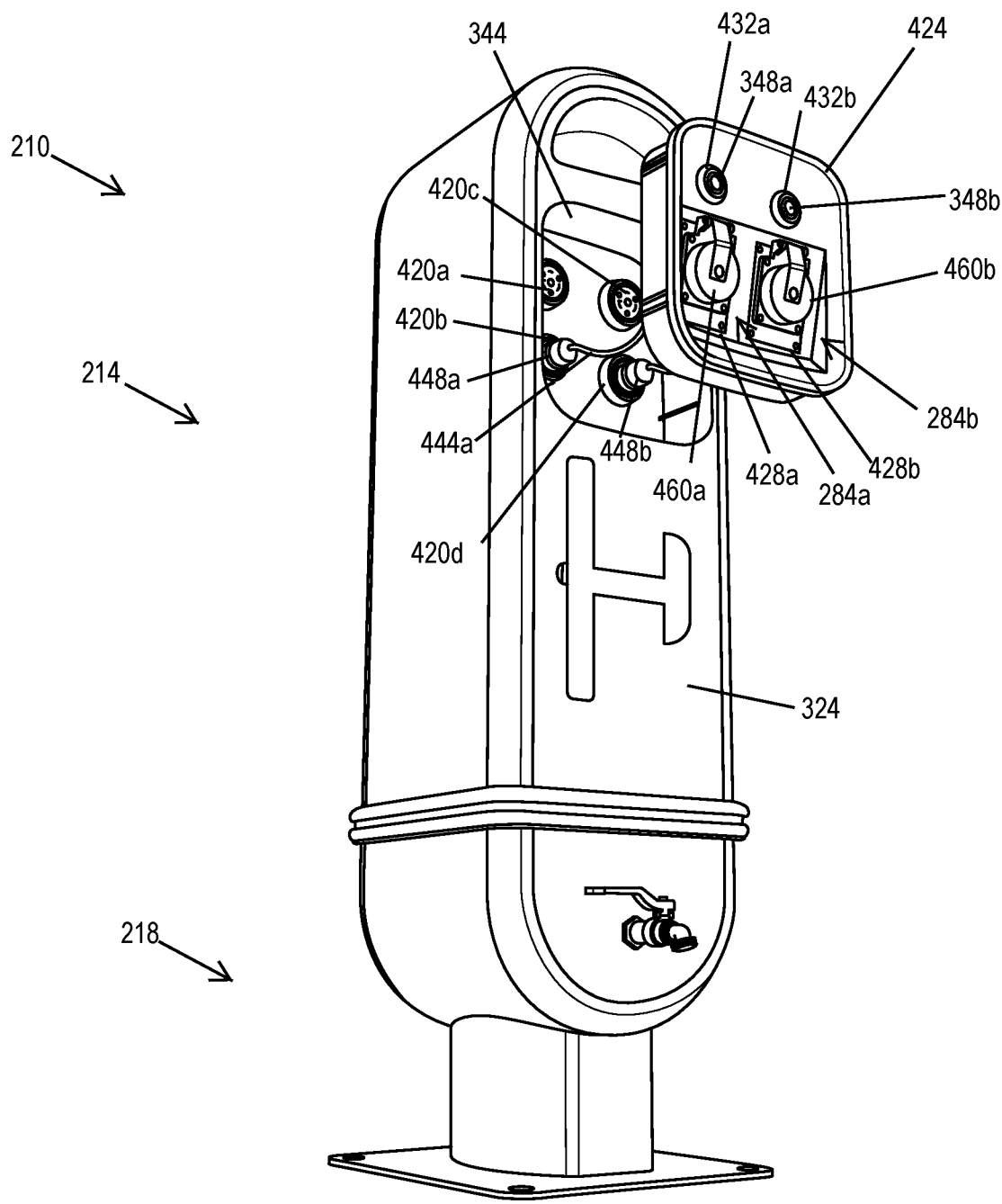
FIG. 18 is another partially exploded perspective view of the power assembly of FIG. 14.
Figure 19:
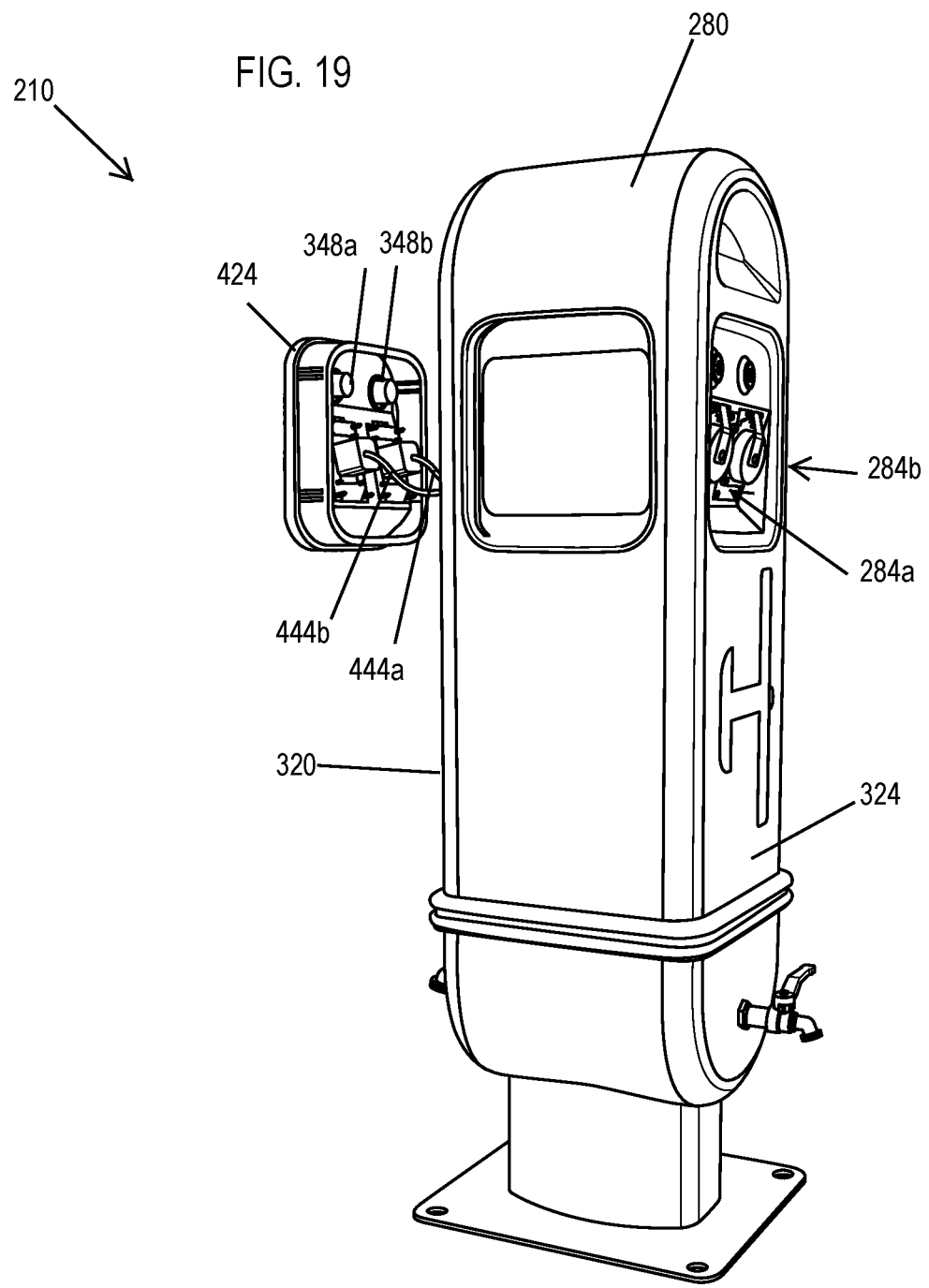
FIG. 19 is another partially exploded perspective view of the power assembly of FIG. 14.
Figure 20:
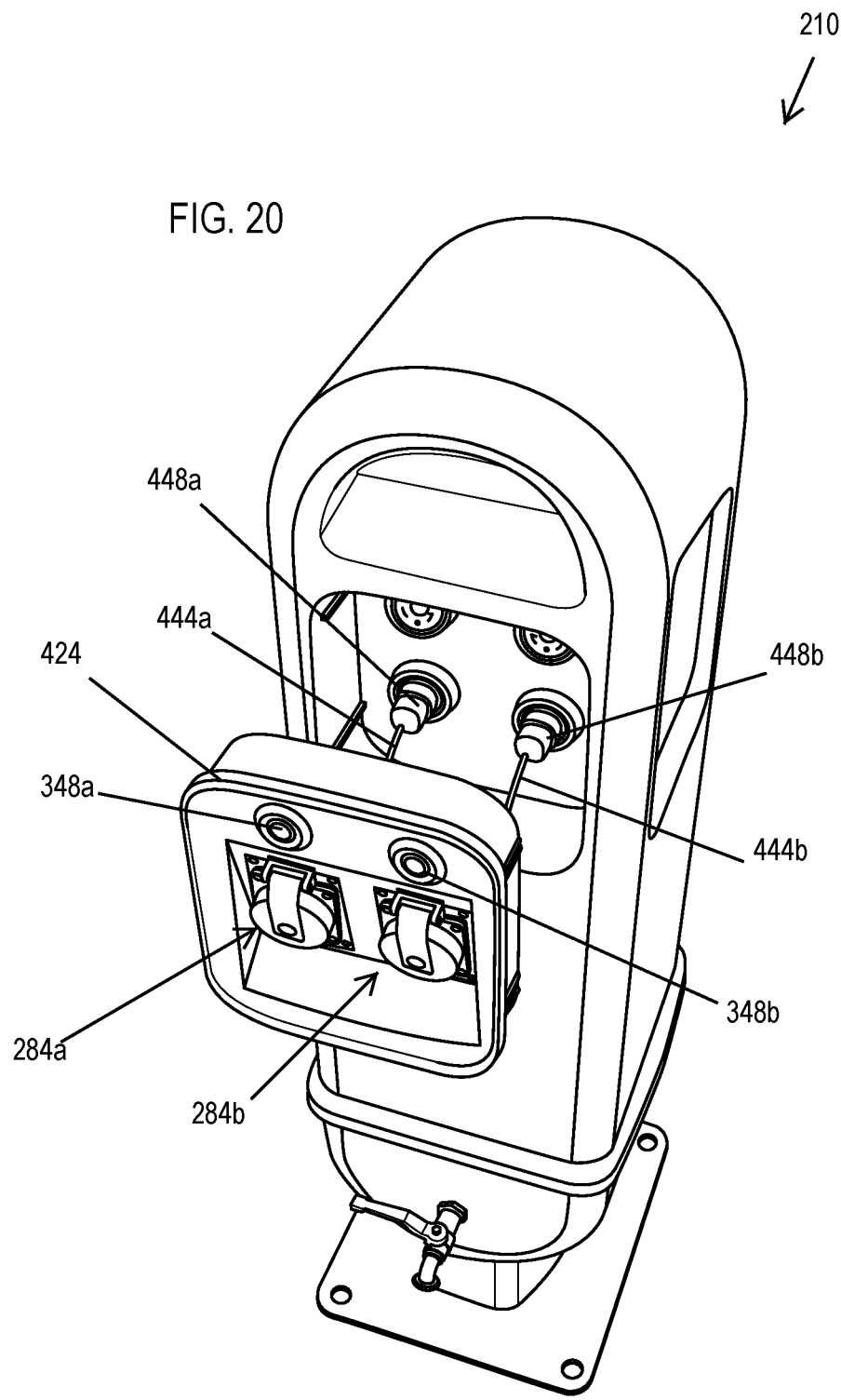
FIG. 20 is another partially exploded perspective view of the power assembly of FIG. 14.

FIGS. 14-16 illustrate a power assembly 210 according to another embodiment. The power assembly 210 of FIGS. 14-16 is similar to the power assembly 10 of FIGS. 1-13, and therefore like structure will be identified with like reference numerals plus "200" and only the differences will be discussed below.

With particular respect to FIG. 15, the coupling mechanism 242 of the base assembly 218 includes are four polygonal apertures 400 that are positioned adjacent corners of the body 246 and extend parallel to the longitudinal axis A. In other or additional embodiments, the apertures 400 may have any suitable number, shape, or orientation relative to the body 246. Similarly, the pedestal assembly 214 includes four shafts or posts 404 that extend from the first end 212 and in parallel to the longitudinal axis A. Each of the posts 404 correspond to an aperture 400 in the coupling mechanism 242 of the base assembly 218. In the illustrated embodiment, the posts 404 have the same polygonal cross-section as the apertures 400 and are positioned in the corners. To couple the pedestal assembly 214 to the base assembly 218, the posts 404 are inserted into the corresponding aperture 400 along the longitudinal axis. A. There may be a snap-fit engagement or interference fit between the posts 404 and the apertures 400.

In other or additional embodiments, the coupling mechanisms used to connect the pedestal assembly 14, 214 and the base assembly 18, 218 may have any suitable configuration. For example, the coupling mechanisms have may be a snap fit connection, a tongue and groove connection, or an electromagnetic (e.g., RFID) connection, among other suitable coupling mechanisms.

With respect to FIGS. 17-21, a plurality of electrical connectors 420a-420d is positioned in each of the recesses 340, 344 and supported by the respective first and second sides 320, 324. Each of the plurality of electrical connectors 420a-420d is configured to be in communication with the controller 308 of the pedestal assembly 218. In the illustrated embodiment, the plurality of electrical connectors 420a-420d includes a first electrical connector 420a, a second electrical connector 420b, a third electrical connector 420c, and a fourth electrical connector 420d. In the illustrated embodiment, the first and second electrical connectors 420a, 420b may include a first power rating (e.g., 30 A) and the second and third electrical connectors 420c, 420d may include a second power rating (e.g., 50 A). In other embodiments, each of the electrical connectors 420a-420d may have other or different power ratings (e.g., 30 A, 50 A, 100 A, etc.). In the illustrated embodiment, each of the plurality of electrical connectors 420a-420d include the same interface (only two of which are shown 404a, 404c). In other embodiments, the plurality of electrical connectors 420a-420d may include different interfaces.

Further with respect to FIGS. 17-20, on each of the first and second sides 320, 324 of the head 280, a static plug board or cover 424 is positioned adjacent to the plurality of connectors 420a-420d. That is the plug board 424 is integrally formed with or otherwise coupled to the head 280 such that the switch board 424 forms part of each of the respective first and second sides 320, 324. The switch board 424 defines a first pair of openings 428a, 428b and a second pair of openings 432a, 432b. The first pair of openings 428a, 428b are each configured to removably receive a power unit 284a, 284b (e.g., receptacle or plug assembly). That is, a first receptacle assembly 284a is received and secured in the first opening 428a of the first pair of openings and a second receptacle assembly 284b is received and secured in the second opening 428b of the first pair of openings. Each of the first and second receptacle assemblies 284a, 284b includes an interface configured to receive a mating interface plug of the vessel and a wire or pigtail 444a, 444b in electrical communication with the interface. For each receptacle assembly 284a, 284b the pigtail 444a, 444b includes an electrical connector 448a, 448b on its distal end that has an interface that is configured to mate with one of the plurality of electrical connectors 420a-420d of the head 280. The pigtail 444a, 444b allows the flexibility to have different combinations of receptacle assemblies 284a, 284b with different interfaces and power ratings to be part of the power assembly 210.

The second pair of openings 432a, 432b receive and secure the micro-switch or actuator 348a, 348b. In particular, a first actuator 348a is received and secured in the first opening 432a of the second pair of openings, and a second actuator 348b is received and secured in the second opening 432b of the second pair of openings. The first actuator 348a is associated with the first receptacle 284a and the second actuator 348b is associated with the second receptacle 284b. The first and second actuators 348a, 348b are configured to toggle power on or off to the respective first and second receptacles 284a, 284b. The actuators 348a, 348b may also ensure that the power will be disconnected to the receptacle assemblies 284a, 284b should the service not be turned off to the pedestal prior to swapping the removable receptacle assemblies 284a, 284b. Although not shown, a sealing device (e.g., a gasket) may seal the interface of the first and second receptacle assemblies 284a, 284b and the first and second actuators 348a, 348b relative to the respective openings 428a, 428b, 432a, 432b in the switch board 424 to prevent moisture and debris from entering the space between the switch board 424 and the plurality of electrical connectors 420a-420d. Moreover, as shown, removable caps 460a, 460b may be used to cover the interfaces of the receptacle assemblies 284a, 284b when not in use.

The first and second receptacle assemblies 284a, 284b on each side 320, 324 may have the same power rating (e.g., the first and second receptacle assemblies 284a, 284b may have 30 A or 50 A power ratings) or the first and second receptacle assemblies 284a, 284b may have different power ratings (e.g., the first receptacle assembly 284a may have a 30 A power rating and the second receptacle 284b assembly may be 50 A power rating or vice versa). The first and second receptacle assemblies 284a, 284b may be couplable to one or more of the plurality of connectors 420a-420d of the head 280 via the electrical connectors 448a, 448b of the pigtails 444a, 444b. For example, if the first and second receptacle assemblies 284a, 284b both have 30 A power ratings, the electrical connector 448a of the first receptacle assembly 284a may couple to one of the first and second electrical connectors 420a, 420b of the head 280 and the electrical connector 448b of the second receptacle assembly 284b may couple to the other of the first and second electrical connectors 420a, 420b of the head 280. In another example, if the first and second receptacle 284a, 284b assemblies both have 50 A power ratings, the electrical connector 448a of the first receptacle assembly 284a may couple to one of the third and fourth electrical connector 420c, 420d of the head 280 and the electrical connector 448b of the second receptacle assembly 284b may couple to the other of the third and fourth electrical connector 420c, 420d of the head 280. In yet another example, if the first receptacle assembly 284a has a 30 A power rating and second receptacle assembly 284b has a 50 A power rating, the electrical connector 448a of the first receptacle assembly 284a may couple to either the first or second electrical connectors 420a, 420b of the head 280 and the electrical connector 448b of the second receptacle assembly 284b couples to either the third or fourth electrical connector 420c, 420d of the head 20.

Figure 21:
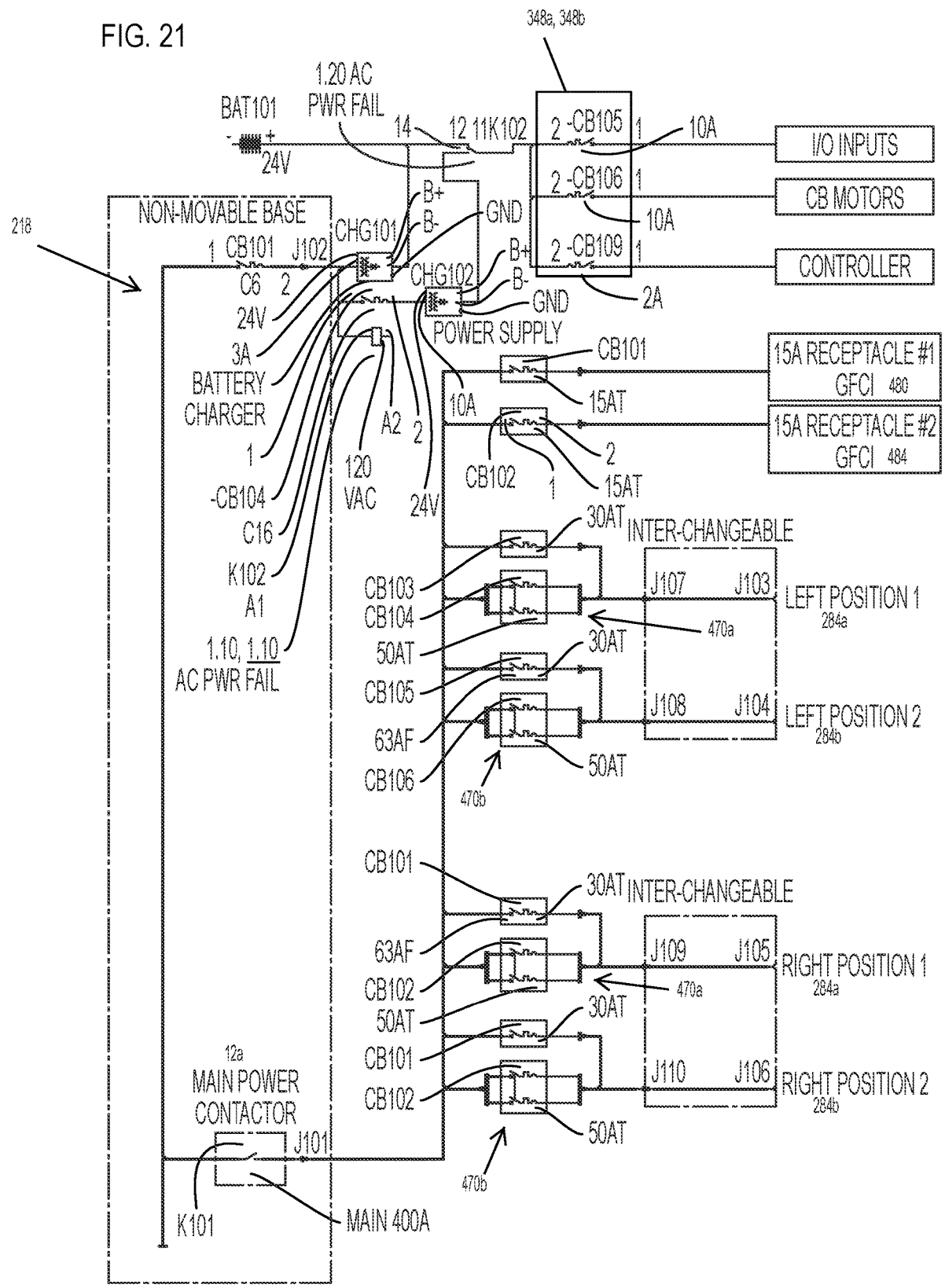
FIG. 21 is an electrical schematic of a portion of the power assembly of FIG. 14.

With respect to FIG. 21, a motorized breaker 470a, 470b is in electrical communication with each of the receptacle assemblies 284a, 284b and associated electrical connector 420a-420d of the head 280. Moreover, a low voltage circuit is in communication with each of the motorized breakers 470a, 470b and the controller 108 of the pedestal assembly 18. The motorized breakers 470a, 470b allow for a user to switch between different receptacle assemblies 284a, 284b. The low voltage circuit controls the respective breaker 470a, 470b to prevent damage to the receptacle assembly 284a, 284b, and therefore the vessel, caused by excess current from an overload or short circuit. Moreover, a ground-fault circuit interrupter (GFCI) 480, 484 may be in electrical communication with each of the first and second receptacle assemblies 284a, 284b, as well.

Although aspects have been described in detail with reference to certain preferred embodiments, variations and modifications exist within the scope and spirit of one or more independent aspects as described.

What is claimed is:

1. A power assembly comprising:
a base assembly including a power source; and
a pedestal assembly including
a head that is removably coupleable to the base assembly,
a controller positioned within the head and configured to be in electrical communication with the power source when the head is coupled to the base assembly, and
a receptacle assembly removably coupleable to the head and configured to be in electrical communication with the controller when the receptacle assembly is coupled to the head for supplying power to a vessel or vehicle,
wherein the head further includes a first electrical connector having a first power rating and a second electrical connector having a second power rating, each of the first electrical connector and the second electrical connector configured to be in electrical communication with the controller, and
wherein the receptacle assembly includes an interface for receiving a mating interface of a plug of the vessel or vehicle and a pigtail in electrical communication with the interface and having an electrical connector configured to physically and electrically couple to one of the first electrical connector and the second electrical connector of the head, wherein the receptacle assembly has the same power rating as one of the first electrical connector or the second electrical connector of the head.

2. The power assembly of claim 1, wherein the head is removably coupled to the base assembly by fasteners.

3. The power assembly of claim 1, wherein the head includes at least one shaft and the base assembly includes at least one aperture, the at least one shaft being receivable in the at least one aperture.

4. The power assembly of claim 1, wherein the head further includes and supports an illumination device and a display screen, the illumination device and the display screen configured to be in electrical communication with the controller.

5. The power assembly of claim 1, further comprising a cover that is removably coupleable to the base assembly to cover the base assembly when the head of the pedestal assembly is removed from the base assembly.

6. The power assembly of claim 1, wherein the head further includes and supports a cord management device.

7. A power assembly comprising:
a base assembly including a power source; and
a pedestal assembly including
a head that is removably coupleable to the base assembly,
a controller positioned within the head and configured to be in electrical communication with the power source when the head is coupled to the base assembly, and
a first receptacle assembly removably coupleable to the head and configured to be in electrical communication with the controller when the first receptacle assembly is coupled to the head for supplying power to a first device,
wherein the first receptacle assembly is replaceable with a second receptacle assembly, the second receptacle assembly being removably coupleable to the head and configured to be in electrical communication with the controller when the second receptacle assembly is coupled to the head for supplying power to a second device,
wherein the head further includes a first electrical connector having a first power rating and a second electrical connector having a second power rating, each of the first electrical connector and the second electrical connector being in electrical communication with the controller, and wherein the first receptacle assembly includes an interface for receiving a first mating interface of a plug of the first device and a first pigtail in electrical communication with the first interface and having a first electrical connector configured to physically and electrically couple to one of the first electrical connector and the second electrical connector of the head, wherein the first receptacle assembly has the same power rating as the one of the first electrical connector or the second electrical connector of the head.

8. The power assembly of claim 7, wherein the first receptacle assembly has a first power rating and the second receptacle assembly has a second, different power rating.

9. The power assembly of claim 7, wherein the head is removably coupled to the base assembly by fasteners.

10. The power assembly of claim 7, wherein the head includes at least one shaft and the base assembly includes at least one aperture, the at least one shaft being receivable in the at least one aperture.

11. The power assembly of claim 7, wherein the head further includes and supports an illumination device, a display screen and a cord management device, the illumination device and the display screen configured to be in electrical communication with the controller.

12. A The power assembly of claim 7, wherein the second receptacle assembly includes an interface for receiving a second mating interface of a plug of the second device and a second pigtail in electrical communication with the second interface and having a second electrical connector configured to physically and electrically couple to the other of the first electrical connector and the second electrical connector of the head, wherein the second receptacle assembly has the same power rating as the other of the first electrical connector or the second electrical connector of the head.

13. A The power assembly of FIG. 12, wherein the pedestal assembly further includes a third receptacle assembly that is removably coupleable to the head and configured to be in electrical communication with the controller when the third receptacle assembly is coupled to the head for supplying power to a third device, and wherein the third receptacle assembly includes an interface for receiving a third mating interface of a plug of the third device and a third pigtail in electrical communication with the third interface and having a third electrical connector configured to physically and electrically couple to a third electrical connector supported by the head, wherein the third electrical connector of the head has a third power rating and the third receptacle assembly has the same power rating as the third electrical connector of the head.

14. A method for assembling a power assembly, the method comprising:
    electrically and physically coupling a head of a pedestal assembly to a base assembly that accommodates a power source; and
    electrically and physically coupling a receptacle assembly to the head of the pedestal assembly, the receptacle assembly configured to provide power from the power source to a device,
    wherein the head further includes a first electrical connector having a first power rating and a second electrical connector having a second power rating, each of the first electrical connector and the second electrical connector configured to be in electrical communication with the controller, and
    wherein the receptacle assembly includes an interface for receiving a mating interface of a plug of the vessel or vehicle and a pigtail in electrical communication with the interface and having an electrical connector configured to physically and electrically couple to one of the first electrical connector and the second electrical connector of the head, wherein the receptacle assembly has the same power rating as one of the first electrical connector or the second electrical connector of the head.

15. The method of claim 14, wherein the receptacle assembly is a first receptacle assembly and further comprising electrically and physically coupling a second receptacle assembly to the head of the pedestal assembly, the second receptacle assembly configured to provide power from the power source to another device.

16. The method of claim 15, further comprising electrically and physically decoupling the first receptacle assembly from the head of the pedestal assembly and electrically and physically coupling a third receptacle assembly to the head of the pedestal assembly, wherein the third receptacle assembly is configured to provide power from the power source to a third device, and wherein the third receptacle assembly has a different power rating than the first receptacle assembly.

* * * * *